(12) United States Patent
Chow et al.

(10) Patent No.: US 9,306,511 B2
(45) Date of Patent: Apr. 5, 2016

(54) POWER AMPLIFIER AND DISTRIBUTED FILTER

(71) Applicant: Avago Technologies General IP (Singapore) Pte. Ltd., Singapore (SG)

(72) Inventors: Yut Hoong Chow, Penang (MY); Wen Hue Chiok, Penang (MY); Ray Kooi Tatt Chuah, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 79 days.

(21) Appl. No.: 13/953,955

(22) Filed: Jul. 30, 2013

(65) Prior Publication Data

US 2015/0035599 A1 Feb. 5, 2015

(51) Int. Cl.
| | |
|---|---|
| *H03F 3/68* | (2006.01) |
| *H03F 3/193* | (2006.01) |
| *H03F 3/21* | (2006.01) |
| *H03H 9/70* | (2006.01) |
| *H03H 11/34* | (2006.01) |
| *H03H 7/38* | (2006.01) |
| *H03H 11/28* | (2006.01) |

(52) U.S. Cl.
CPC ............ *H03F 3/193* (2013.01); *H03F 3/211* (2013.01); *H03H 9/70* (2013.01); *H03H 11/34* (2013.01); *H03F 2203/21157* (2013.01); *H03H 7/38* (2013.01); *H03H 11/28* (2013.01); *H03H 2250/00* (2013.01)

(58) Field of Classification Search
USPC .................... 330/295, 124 R, 84, 286, 53
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,107,721 A | 8/2000 | Lakin | |
| 6,507,983 B1 | 1/2003 | Ruby et al. | |
| 7,280,007 B2 | 10/2007 | Feng et al. | |
| 7,388,454 B2 | 6/2008 | Ruby et al. | |
| 7,427,895 B1 * | 9/2008 | Okubo et al. | ............. 330/124 R |
| 7,629,865 B2 | 12/2009 | Ruby | |
| 7,656,228 B2 | 2/2010 | Fukuda et al. | |
| 8,198,958 B1 | 6/2012 | Aigner et al. | |
| 2007/0205850 A1 | 9/2007 | Jamneala et al. | |
| 2010/0253435 A1 | 10/2010 | Ichitsubo et al. | |
| 2010/0327697 A1 | 12/2010 | Choy et al. | |
| 2010/0327994 A1 | 12/2010 | Choy et al. | |
| 2013/0021104 A1 * | 1/2013 | Schmidt | ........................ 330/295 |

OTHER PUBLICATIONS

Co-pending U.S. Appl. No. 13/036,489, filed Feb. 28, 2011.
Raab, "High-Efficiency RF Power Amplifiers and Transmitters", Green Mountain Radio Research Company, GMRR VG08-7A, 2009.

* cited by examiner

*Primary Examiner* — Hieu Nguyen

(57) ABSTRACT

A system comprises a power amplifier configured to amplify an input signal, a splitter configured to split the amplified input signal into a plurality of output signals, a plurality of filters configured to filter the plurality of output signals, respectively, to produce a plurality of filtered output signals, and a combiner configured to combine the filtered output signals to produce a combined output signal.

18 Claims, 9 Drawing Sheets

POWER AMPLIFIER AND DISTRIBUTED FILTER

BACKGROUND

Communication systems often use a power amplifier in combination will) a filter to produce an output signal with desired characteristics. For instance, transceivers in radio frequency (RF) communication systems often use a power amplifier with a filter at its output to produce an output signal within a predetermined transmit band or receive band.

Many communication systems implement such a filter with one or more acoustic resonators. Examples of such acoustic resonator filters include thin film bulk acoustic resonator (FBAR), surface acoustic wave (SAW) resonator, and bulk acoustic wave (BAW) resonator filters. In general, acoustic resonator filters may have several attractive performance characteristics, but they may also suffer from significant shortcomings when operated close to their maximum power handling limits.

FIG. 1A is a schematic diagram of a conventional system 100A comprising a power amplifier and an FBAR filter, and FIG. 1B is a conceptual diagram of another conventional system comprising a power amplifier and an FBAR filter.

Referring to FIG. 1A, system 100A comprises a monolithic microwave integrated circuit (MMIC) 105, an RF matching circuit 110, and an FBAR filter 115, MMIC 105 is connected to RF matching circuit 110 via an inductive circuit L1, typically comprising mutually inductive bondwires. Collectively, the above features constitute a power amplifier (PA) module that receives and amplifies an input RF signal RF_in to produce and output RF signal RF_out.

MMIC 105 comprises multiple gain stages each comprising an amplifier in the form of a field effect transistor (FET). More specifically, a first stage comprises a first amplifier (FET1), a second stage comprises a second amplifier (FET2), and a third stage comprises a third amplifier (FET3). As illustrated by the labels "Area=X", etc., in FIG. 1A, the size of the FETs in successive stages increases by a factor of eight from the first stage to the third stage. Each of the FETs has a gate receiving an input signal and a drain transmitting an output signal. A first capacitor (C1) is connected between the first and second amplifiers as shown in FIG. 1A, and a second capacitor (C2) is connected between the second and third amplifiers as shown in FIG. 1A. The FETs constituting the first through third amplifiers usually take the form of pseudomorphic high electron mobility transistors (pHEMTs), which are typically formed of gallium arsenide (GaAs). Alternatively, they may use silicon-based technology and bipolar junction transistors or heterojunction bipolar transistors.

RF matching circuit 10 comprises a matching inductor Lm and a matching capacitor Cm, which match the output impedance of MMIC 105 with the input impedance of FBAR filter 115. The components of RF matching circuit 110 are arranged between the output of MMIC 105 and ground, as shown in FIG. 1A.

FBAR filter 115 is typically designed to filter off harmonics or other undesired signals, or to prevent excessive levels from being fed to downstream components. For instance, in a typical application, FBAR filter 115 is disposed between power amplification circuitry and an antenna or switch to prevent undesired harmonics or excessive levels from being fed to the receiver chain of a transceiver.

Referring to FIG. 1B, system 100B comprises an MMIC 105', an RF matching circuit 110', and an FBAR filter 115. MMIC 105' performs a function similar to MMIC 105, except that it contains only two gain stages, labeled "$1^{st}$ Stage" and "$2^{nd}$ Stage", respectively. Like MMIC 105, the gain stages of MMIC 105' are typically implemented by FETs. MMIC 105' further comprises a switch for controlling the transmission of the RF input signal RF_in to MMIC 105', and a bias circuit for biasing one or both of the gain stages.

An output of the transistor forming the "$2^{nd}$ Stage" is joined together at a first bondpad and eight bandwires are connected from the first bondpad to a second bondpad. The second bondpad is electrically connected to RF matching circuit 110', which operates similar to RF matching circuit 110, and RF matching circuit 110' is connected to FBAR filter 115.

In the example of FIGS. 1A and 1B, the FBAR filter may exhibit desirable characteristics such as sharp rolloff, small-size, and minimal variation across temperature. However, at high power levels, its performance may degrade. This degradation may take various forms, of which the following are two examples.

First, at high input power levels the FBAR filter may suffer physical damage, diminishing its overall reliability. Nevertheless, this is a risk that that some users are willing to take in order to achieve desired performance. Second, the FBAR filter tends to exhibit nonlinear distortion when input signal excursions approach the maximum power handling capability of the device.

In general, it is difficult to overcome these shortcomings in a system having the general configuration illustrated in FIGS. 1A and 1B, because the size of the FBAR filter is determined by its passband. In other words, it is not possible to make a larger FBAR filter to distribute the power handling of the filter because such a larger filter would change the passband and rolloff characteristics. Accordingly, the above shortcomings tend to limit the usability of FBAR filters in high power applications.

SUMMARY

In a representative embodiment, a system comprises a power amplifier configured to amplify an input signal, a splitter configured to split the amplified input signal into a plurality of output signals, a plurality of filters configured to filter the plurality of output signals, respectively, to produce a plurality of filtered output signals, and a combiner configured to combine the filtered output signals to produce a combined output signal.

In another representative embodiment, a method comprises amplifying an input signal, splitting the amplified input signal into a plurality of output signals, filtering the plurality of output signals, respectively, to produce a plurality of filtered output signals, and combining the filtered output signals to produce a combined output signal.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
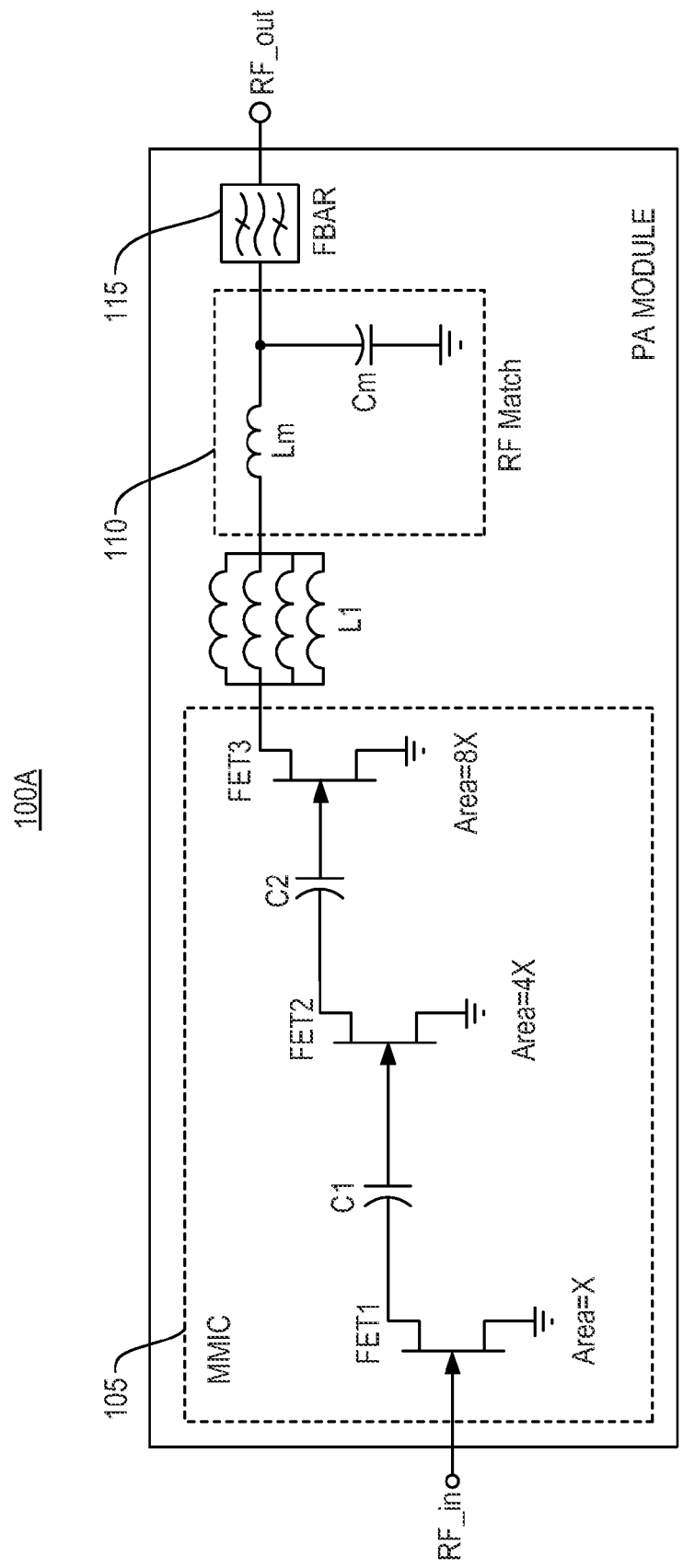
FIG. 1A is a schematic diagram of a conventional system comprising a power amplifier and an acoustic resonator filter.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

In the following detailed description, for purposes of explanation and not limitation, example embodiments disclosing specific details are set forth in order to provide thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms 'a', 'an' and 'the' include both singular and plural referents, unless the context clearly dictates otherwise. Thus, for example, 'a device' includes one device and plural devices. The terms 'substantial' or 'substantially' mean to within acceptable limits or degree. The term 'approximately' means to within an acceptable limit or amount to one of ordinary skill in the art. Relative terms, such as "above," "below," "to ," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Other relative terms may also be used to indicate the relative location of certain features along a path such as a signal path. For instance, a second feature may be deemed to "follow" a first feature along a signal path if a signal transmitted along the path reaches the second feature before the second feature.

The described embodiments relate generally to power amplification and filtering in communication systems, such as RF transceivers. In certain embodiments, such a system comprises a power amplifier that amplifies an RF input signal and transmits the amplified input signal to multiple pathways each comprising an FBAR filter. An output of each FBAR filter is subsequently recombined and matched to an output impedance of the system. This way, each FBAR filter has to handle only a fraction of the total output power of the power amplifier.

The added cost and size associated with the additional FBAR filters and matching components are usually insignificant compared to cavity filters and high power ceramic or SAW filters used in some applications. Moreover, even with the addition of multiple FBARs, a size benefit of the distributed FBAR filter may far outweigh countervailing issues presented by alternative technologies. Additionally, multiple FBAR filters can be fabricated, on a single die with multiple bondpads to further reduce size.

The described embodiments may find ready application in any of various contexts performing RF communication. Moreover, some embodiments may be particular well suited for communication systems operating at relatively high power, such as base stations, picocell/enterprise femtocell transmitters.

Although several embodiments are described with reference to FBARs, other types of acoustic resonators can be substituted for the FBARs. Examples of such other acoustic resonators include stacked bulk acoustic resonators (SBARs), double bulk acoustic resonators (DBARs), SAW resonators, and BAW resonators, to name but a few.

Certain aspects of FBARs and other forms of acoustic resonators, such as their structure, materials, and methods of fabrication, may be found in one or more of the following U.S. patents and patent applications: U.S. Pat. No. 6,107,721 (Aug. 22, 2000) to Lakin; U.S. Pat. No. 5,587,620 (Dec. 24, 1996), U.S. Pat. No. 5,873,153 (Feb. 23, 1999) U.S. Pat. No. 6,507,983 (Jan. 21, 2003) and U.S. Pat. No. 7,388,454 (Jun. 17, 2008) to Ruby, et al,; U.S. Pat. No. 7,629,865 (Dec. 8, 2009) to Ruby; U.S. Pat. No. 7,280,007 (Oct. 9, 2007) to Feng et al.; U.S. Pat. App. Pub. No. 2007/0205850, entitled "Piezoelectric Resonator Structures and Electrical Filters having Frame Elements" to Jamneala et al.; U.S. Pat. App. Pub. No, 2010/0327697, entitled "Acoustic Resonator Structure Comprising a Bridge" to Choy et al.; U.S. Pat. App. Pub. No, 2010/0327994, entitled "Acoustic Resonator Structure having an Electrode with a Cantilevered Portion" to Choy et al.; and U.S. patent application Ser. No. 13/036,489, entitled "Coupled Resonator Filter Comprising a Bridge" to Burak filed on Feb. 28, 2011. The disclosures of these patents and patent applications are hereby incorporated by reference. It is emphasized that the components, materials and method of fabrication described in these patents and patent applications are representative and other methods of fabrication and materials within the purview of one of ordinary skill in the art are contemplated.

Figure 2A:
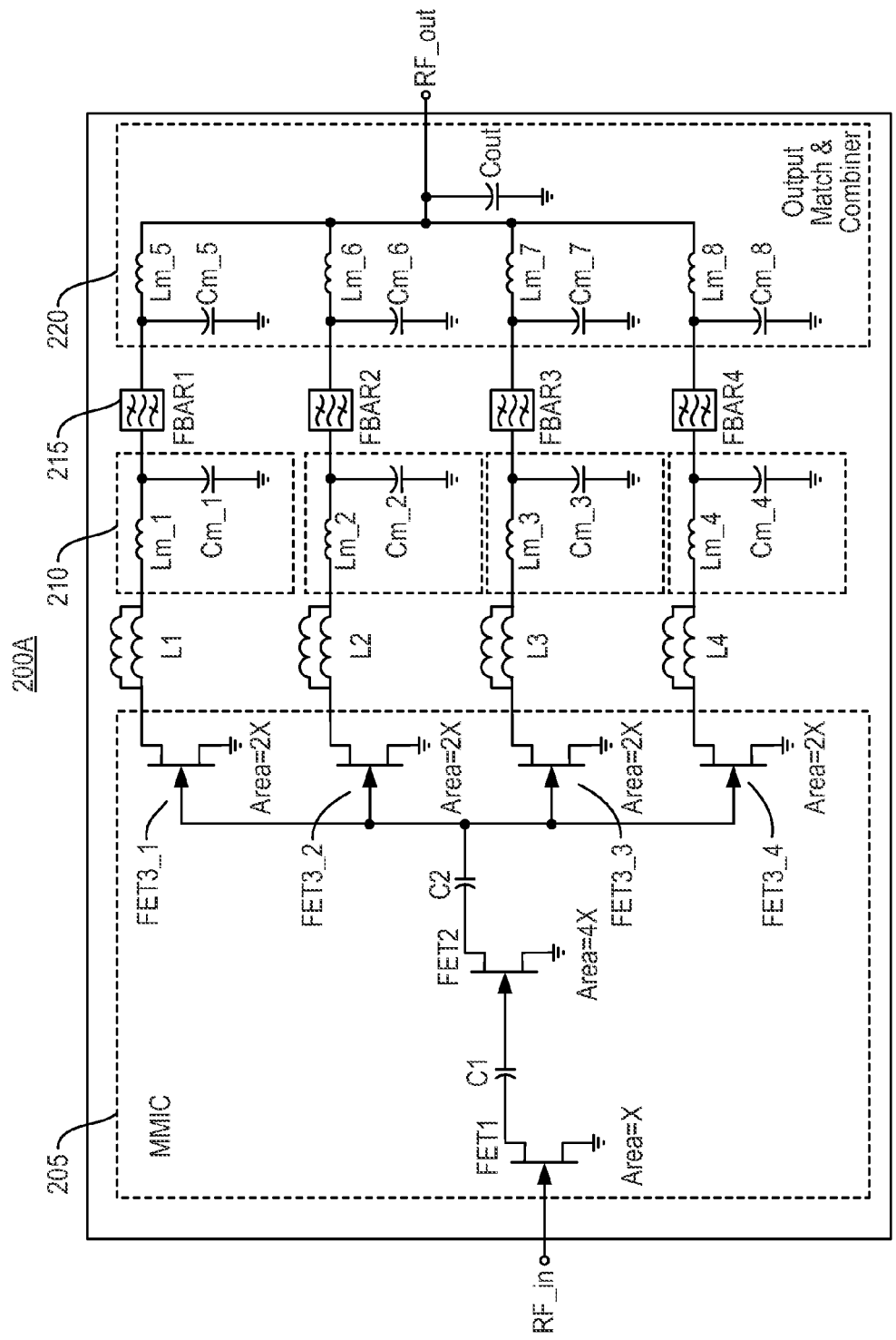
FIG. 2A is a schematic diagram of a system comprising a power amplifier and multiple acoustic resonator filters, according to a representative embodiment.
Figure 2B:
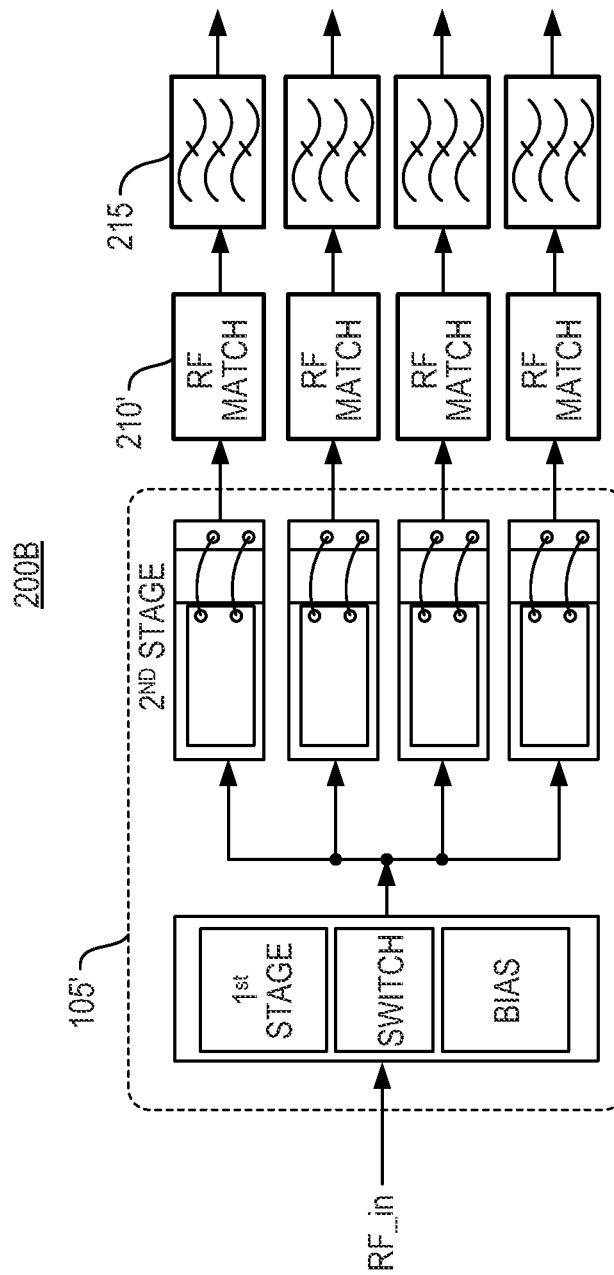
FIG. 2B is a conceptual diagram of another system comprising a power amplifier and multiple acoustic resonator filters, according to a representative embodiment.

FIG. 2A is a schematic diagram of a system 200A comprising a power amplifier and distributed acoustic resonator filters, according to a representative embodiment, and FIG. 2B is a conceptual diagram of another system 200B comprising a power amplifier and distributed acoustic resonator filters, according to a representative embodiment.

Referring to FIG. 2A system 200A comprises an MMIC 205, an RF matching block 210, and an FBAR filter block 215, and an output matching/combining block 220. MMIC 205 is connected to RF matching block 210 via a plurality of inductive circuits L1 through L4, typically comprising mutually inductive bondwires. Where the individual bondwires that make up each inductive circuit are mutually inductive, but they are isolated from the bondwires of the other inductive circuits. Collectively, the above features constitute a PA module that receives and amplifies an input RF signal RF_in to produce and output RF signal RF_out.

MMIC 205 comprises multiple sequential gain stages each comprising an amplifier in the form of a FET. More specifically, a first stage comprises a first amplifier (FET1), a second stage comprises a second amplifier (FET2), and a third stage comprises third through sixth amplifiers (FET3_1, FET3_2, FET3_3, and FET3_4) arranged in parallel and connected to respective output ports of the power amplifier. Collectively, the third through sixth amplifiers function to amplify the input RF signal. As illustrated by the labels "Area=X", etc., in FIG. 2A, the size of the FETs changes from X to 4X to 2X in successive stages. A first capacitor (C1) is connected between the first and second amplifiers as shown in FIG. 2A, and a second capacitor (C2) is connected between the second and third amplifiers as shown in FIG. 2A. The FETs constituting the first through sixth amplifiers usually take the form of GaAs pHEMTs.

Although MMIC 205 comprises three gain stages, in alternative embodiments it could comprise a different number of stages. For instance, in the embodiment illustrated in FIG. 2B, an MMIC 205' comprises only two gain stages. In still other embodiments, it could comprise fewer than two gain stages, or more than three gain stages. Additionally, although the third stage of MMIC 205 (i.e., the output stage) is divided into four separate signal paths, in alternative embodiments the output stage could be divided into a different number of paths. For instance, it could be divided into two paths, three paths, or any other number of paths, with downstream portions of system 200A using corresponding numbers of components, e.g., two FBAR filters, three FBAR filters, or some other number of FBAR filters.

RF matching block 210 comprises first through fourth RF matching circuits corresponding to the four signal paths at the output stage of MMIC 205. Each of the first through fourth RF matching circuits comprises a matching inductor and a matching capacitor Cm_i, where i∈{1, 2, 3, 4}. In other words, each of the matching circuits comprises a inductance-capacitance (LC) circuit. The components of each RF matching circuit are arranged between the corresponding signal path of MMIC 205 and ground as shown in FIG. 2A, and they are configured to match the output impedance of the corresponding signal path with the input impedance of a corresponding FBAR filter.

FBAR filter block 215 comprises four FBAR titters, labeled FBAR1 through FBAR4. The FBAR filters are typically designed to have substantially the same transfer function, e.g., the same passband, etc. Their combined operation is designed to mimic the operation of a single FBAR filter, but without the high power handling issues. For example, each FBAR filter is typically designed to filter off harmonics or other undesired signals, or to prevent excessive levels from being fed to downstream components. Due to their combined function, the four FBARs of FBAR filter block 215 can be referred to collectively as a distributed filter, or distributed FBAR filter.

Output matching/combining block 220 comprises fifth through eighth RF matching circuits corresponding to four respective outputs of FBAR filter block 215. Each of the fifth through eighth RF matching circuits comprises a matching inductor and a matching capacitor Cm_i, where i∈{5, 6, 7, 8}. The components of each RF matching circuit are arranged between the corresponding signal path of MMIC 205 and ground, as shown in FIG. 2A, and they are configured to match the output impedance of the corresponding FBAR filter with the output impedance of system 200A. The respective outputs of the fifth through eighth RF matching circuits are combined to produce output RF signal RF_out. A capacitor Cout is located at the output of system 200A to remove unwanted frequencies at that location.

Referring to FIG. 2B, system 200B comprises an MMIC 205', an RF matching block 210', and an FBAR filter block 215. Although not shown, system 200B may further comprise output matching/combining block 220. MMIC 205' performs a function similar to MMIC 205, except that it contains only two gain stages, labeled "$1^{st}$ Stage" and "$2^{nd}$ Stage", respectively. The $2^{nd}$ stage of MMIC 205' has an implementation similar to the third stage (i.e., the output stage) of MMIC 205, in that it comprises four separate transistors each configured to amplify the same signal. Like MMIC 205, the gain stages of MMIC 205' are typically implemented by FETs. MMIC 205' further comprises a switch for controlling the transmission of the RF input signal RF_in to MMIC 205', and a bias circuit for biasing one or both of the gain stages.

Figure 1B:
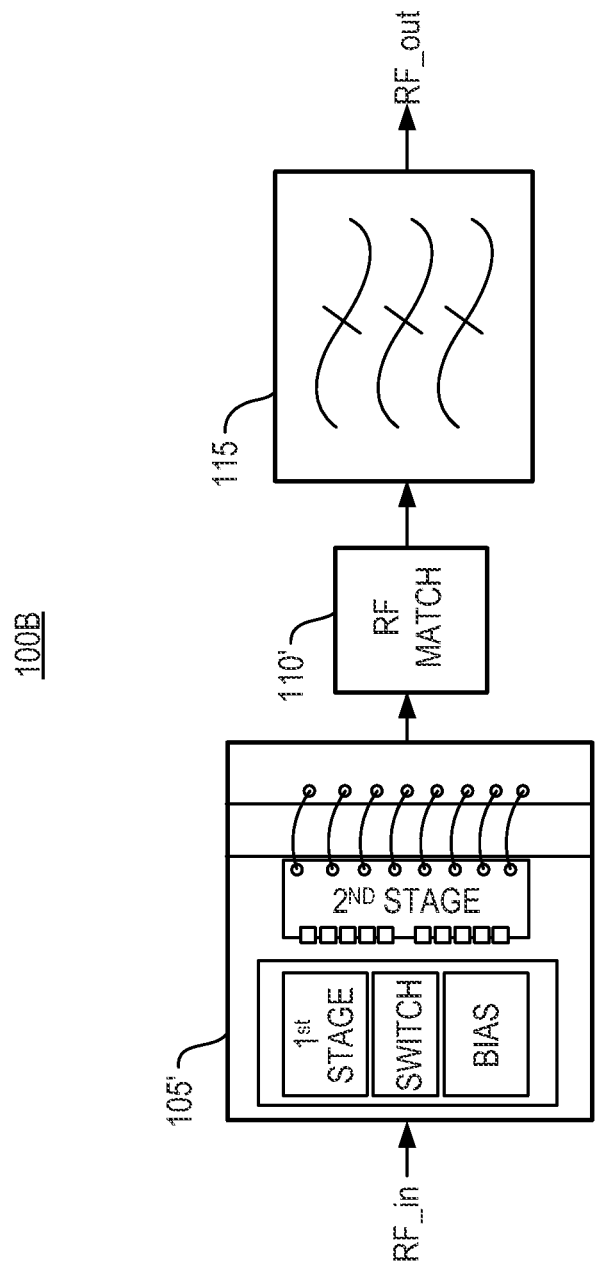
FIG. 1B is a conceptual diagram of another conventional system comprising a power amplifier and an acoustic resonator filter.

Respective outputs of the transistors forming the "$2^{nd}$ Stage" are joined together at a four corresponding bondpads, and two bondwires are connected from each of the four bondpads to four other bondpads. The four other bondpads are electrically connected to RF matching block 210', which operates similar to RF matching block 210, and RF matching block 110' is connected to FBAR filter block 215. As illustrated by a comparison of FIG. 2B and FIG. 1B, the transistors in the "$2^{nd}$ Stage" of system 200B can be implemented four times smaller than the transistor in the "$2^{nd}$ Stage" of system 100B.

By comparison with system 100B, the input power to each FBAR filter in system 200B is only one quarter that of the FBAR filter 115. The reduced input power tends to significantly reduce intermodulation distortion (IMD) produced by the filters. In addition, the reduced size transistors at the output of MMIC 205' tend to have increased impedance compared to the transistor at the output of MMIC 105. This increased impedance tends to reduce the output impedance transformation ratio that would normally be required in system 200B, which may result in an increase in linear bandwidth and a reduction in losses due to matching components. For instance, in one implementation, a 16 mm FET has an output impedance of 1.5 Ohm while a 4 mm device has an output impedance of 6.4 Ohm. The 16 mm FET can be used in the third stage in system 100A (FET3), while the 4 mm FET can be used in the third stage of system 200A (FET3_1, FET3_2, FET3_3, FET3_4). In addition, in the context of systems 200A and 200B, FBAR filters designed with lowered input impedance (lower than 50 Ohm nominal) can also be used to directly match with the output impedance of each of the corresponding FET outputs.

The following Table 1 illustrates a general comparison of various operating parameters of the respective third gain stages of systems 100A and 200A, as observed in simulation. The results shown in Table 1 were obtained with the components operating at 2.412 GHz, 5V using a physical-based E-mode pHEMT model. Real component values were used with losses included in the models. As illustrated by the values in Table 1, there is substantially no difference in performance between the two gain stages. Slight differences between the illustrated values are due to harmonic termination effects.

TABLE 1

| Parameter | System 100A | System 200A |
| --- | --- | --- |
| Gain/dB | 13.4 | 13.3 |
| Psat/dBm | 37.7 | 37.4 |
| I_total @ Psat/A | 2.4 | 2.3 |

Figure 3A:
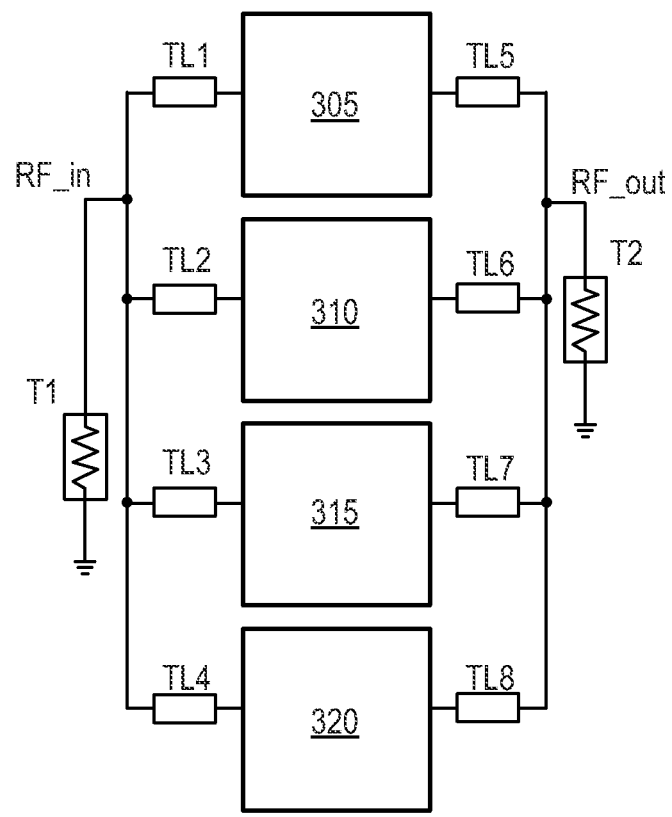
FIG. 3A is a schematic diagram of a distributed filter comprising multiple acoustic resonator filters, according to a representative embodiment.
Figure 3B:
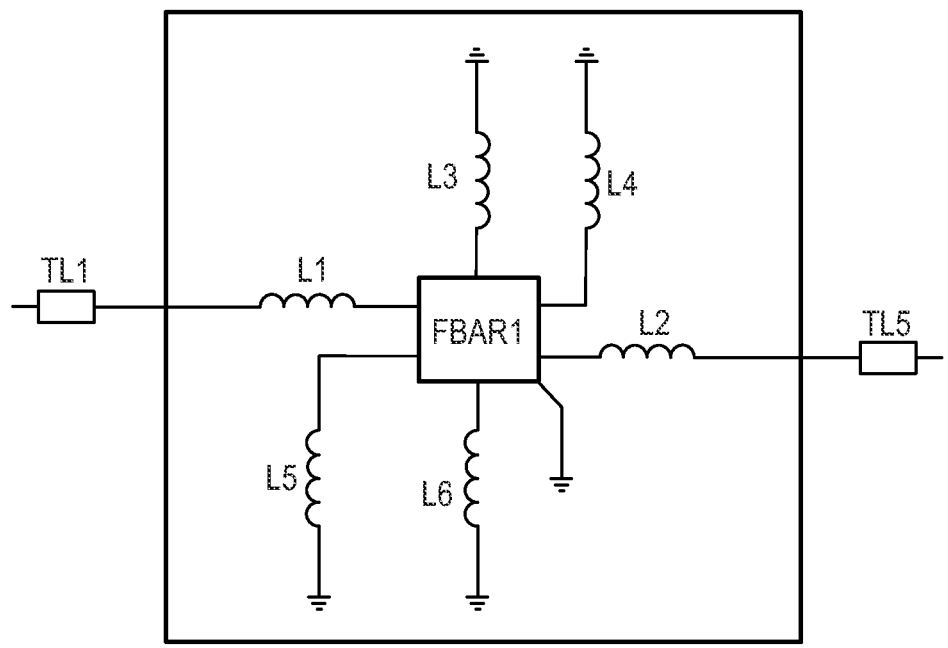
FIG. 3B is a schematic diagram of an example filter block in the distributed filter of FIG. 3A, according to a representative embodiment.

FIG. 3A is a diagram of a distributed filter 300 comprising multiple acoustic resonator filters, according to a representative embodiment. FIG. 3B is a diagram of an example filter block in the distributed filter of FIG. 3A, according to a representative embodiment. Together, these diagrams illustrate how multiple acoustic resonator filters can be combined using transmission lines to form a distributed FBAR filter that quadruples power handling. In FIGS. 3A and 3B, as in other examples, the acoustic resonator filters take the form of FBARs, but they could alternatively be other types of acoustic resonators. In addition, although FIG. 3A shows distributed filter 300 with four FBARs (i.e., a quad distributed filter), it could be modified to include an arbitrary number of FBARs.

In general, distributed filter 300 can be viewed as an alternative, or variation, to systems 200A and 200B, in which the input RF signal RF_in is split into multiple pathways within a power amplifier. Rather than being split within a power amplifier, input RF signal RF_in is divided using an input splitter and then provided to four matched FBAR filters through corresponding transmission lines. The four matched FBAR filters can be combined to an arbitrary impedance.

A typical application of the configuration shown in FIGS. 3A and 3B is to match the filters to an external input impedance that is close to that of a high power transistor. This transistor's output impedance is usually less than 10 Ohms due to the large device periphery/area. By using an input splitter that matches the filters to a lower impedance, power transformation for the transistor can be more readily accomplished with lower variations in system level performance. A filter that would otherwise be able to handle only 30 dBm of input power can now be combined as a single packaged filter that can handle 36 dbm of input power with no degradation of filtering.

Referring to FIG. 3A, distributed filter 300 comprises an input terminal T1, input transmission lines TL1 through TL4, filter blocks 305 through 320, output transmission lines TL5 through TL8, and an output terminal T2.

Input terminal T1 is shown with an impedance corresponding to the output impedance of a power amplifier. e.g., a FET. Input terminal T1 transmits an input signal to each of input transmission lines TL1 through TL4, which then provide the input signal to each of filter blocks 305 through 320. Filter blocks 305 through 320 filter the received input signal and transmit corresponding output signals to output transmission lines. Signals output from output transmission lines TL5 through TL8 are combined and transmitted to output terminal T2.

Referring to FIG. 3B, filter block 305 comprises an FBAR die with helper inductors configured for operation in 2.4 GHz passband. The other filter blocks shown in FIG. 3A may have a structure similar to that of filter block 305 as illustrated in FIG. 3B.

Figure 4A:
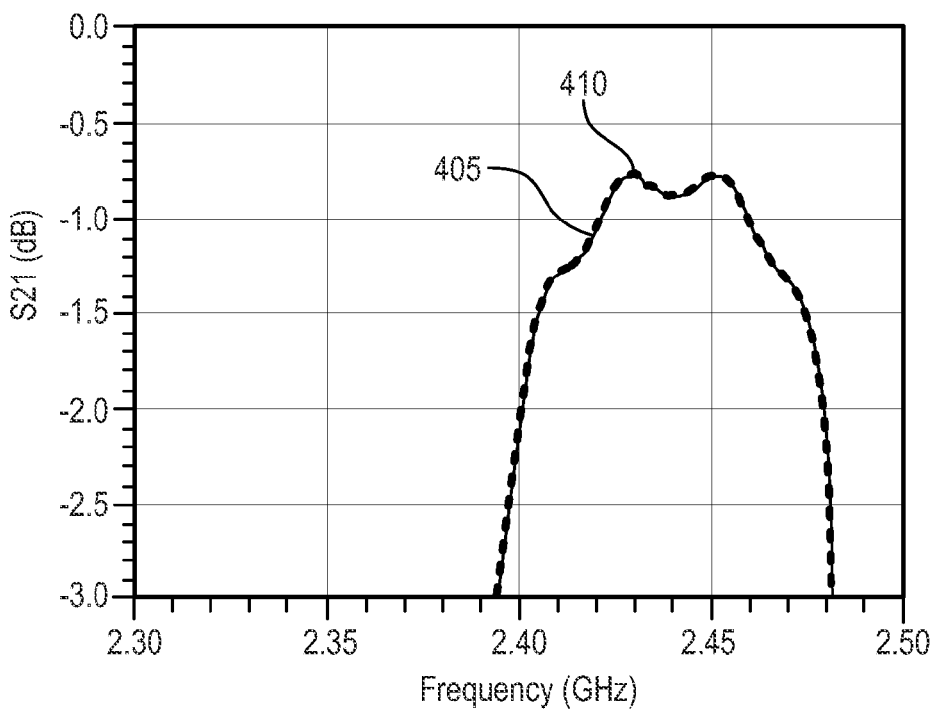
FIG. 4A is a graph illustrating the simulated performance of a single FBAR filter and a quad distributed FBAR filter at passband frequencies.
Figure 4B:
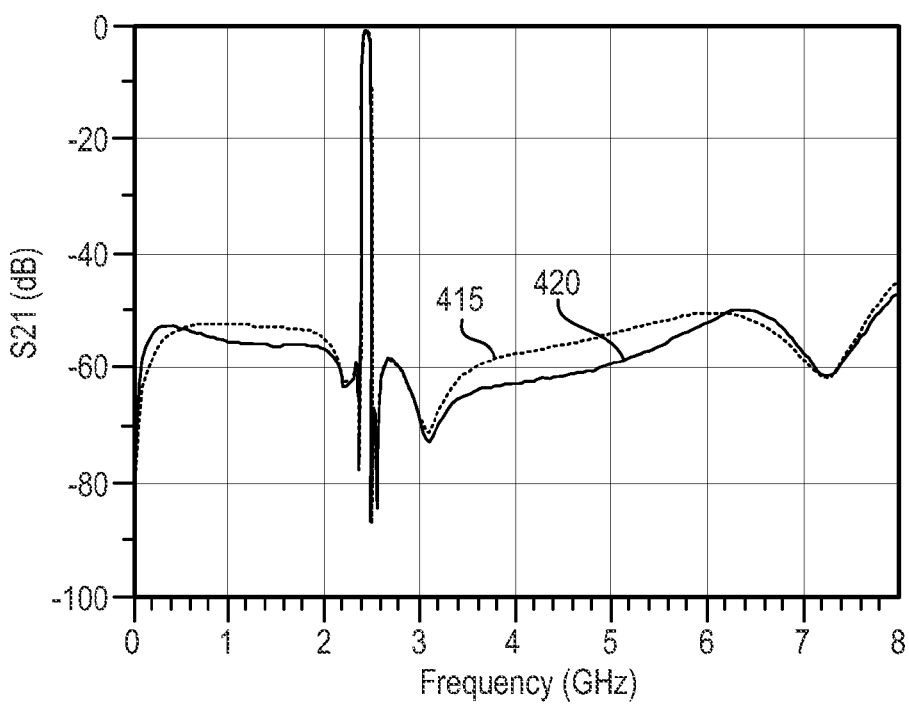
FIG. 4B is a graph illustrating the simulated performance of the single FBAR filter and the quad distributed FBAR filter at both passband frequencies and band-reject frequencies.

FIG. 4A is a graph illustrating the simulated performance of a single FBAR filter and a quad distributed FBAR filter at passband frequencies, and FIG. 4B is a graph illustrating the simulated performance of the single FBAR filter and the quad distributed FBAR filter at both passband frequencies and band-reject frequencies. In the simulation, the quad distributed FBAR filter was produced by combining four FBARs with four quarter-wave transmission lines at its input and its output, and using 50 Ohm terminating impedances.

Referring to FIG. 4A, the S21 performance of the different filters is illustrated over a frequency range from 2.3 GHz and 2.5 GHz, which encompasses their respective passbands. A curve 405 represents the performance of the single FBAR filter, and a curve 410 represents the performance of the quad distributed FBAR filter. As illustrated by these curves, the performance of the two filters is substantially identical at passband frequencies. Thus, it is possible to various benefits of the quad configuration, such as improved power handling, without sacrificing filtering performance in the passband.

Referring to FIG. 4B, the S21 performance of the different filters is illustrated over a frequency range from 0 GHz to 8 GHz, which encompasses both their passband frequencies and band-reject frequencies. A curve 415 represents the performance of the single FBAR filter, and a curve 420 represents the performance of the quad distributed FBAR filter. As illustrated by these curves, the quad distributed FBAR filter has better rejection at close-in frequencies that are critically close to the passband. Otherwise, the two filters exhibit similar performance at band-reject frequencies, with only minor differences that will not significantly impact performance.

Figure 5A:
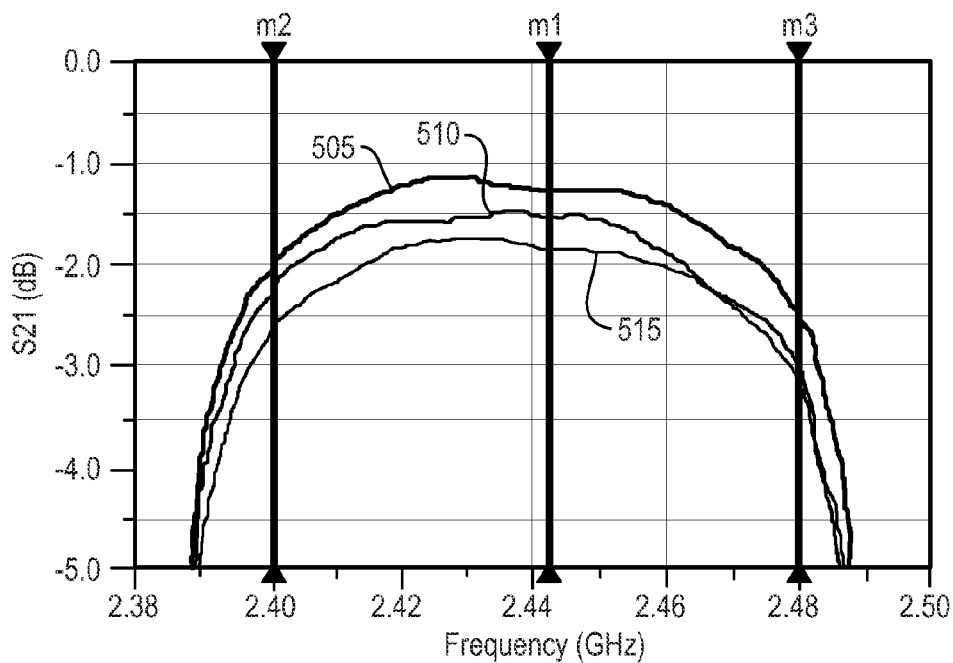
FIG. 5A is a graph illustrating the measured performance of a single FBAR filter, a dual distributed FBAR filter, and a quad distributed FBAR filter, respectively, at passband frequencies.
Figure 5B:
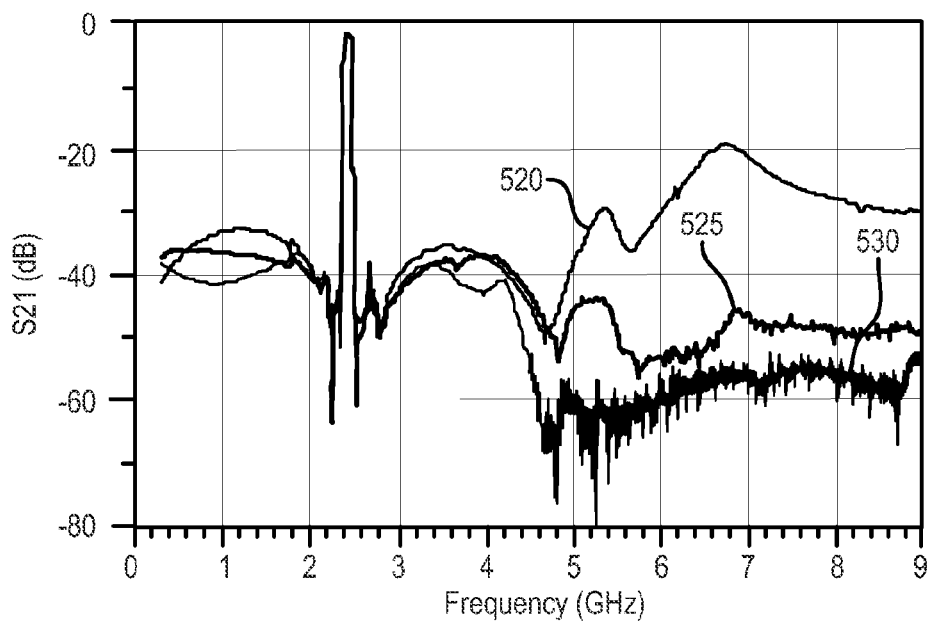
FIG. 5B is a graph illustrating the measured passband performance of a single FBAR filter, a dual distributed FBAR filter, and a quad distributed FBAR filter, respectively, at both passband frequencies and band-reject frequencies.

FIG. 5A is a graph illustrating the measured performance of a single FBAR filter, a dual distributed FBAR filter, and a quad distributed FBAR filter, respectively, at passband frequencies. FIG. 5B is a quad illustrating the measured passband performance of a single FBAR filter, a dual distributed FBAR filter, and a quad distributed FBAR filter, respectively, at both passband frequencies and band-reject frequencies.

Referring to FIG. 5A, the S21 performance of the different filters is illustrated over a frequency range from 2.3 GHz and 2.5 GHz, which encompasses their respective passbands. A curve 505 represents the performance of the single FBAR filter, a curve 510 represents the performance of the dual distributed FBAR filter, and a curve 515 represents the performance of the quad distributed FBAR filter. As illustrated by these curves, the performance of the three filters is similar at passband frequencies, although increasing the number of distributed FBARs tends to lower the gain in the passband region. This attenuation, i.e., about 0.5 dB for each doubling of the number of FBARs, is due to losses in the matching components included in the dual and quad distributed FBAR filters.

Referring to FIG. 5B, the S21 performance of the different filters is illustrated over a frequency range from 0 GHz to 9 GHz, which encompasses both their passband frequencies and band-reject frequencies. A curve 520 represents the performance of the single FBAR filter, a curve 525 represents the performance of the dual distributed FBAR filter, and a curve 530 represents the performance of the quad distributed FBAR filter. As illustrated by these curves, the dual and quad distributed FBAR filter have better rejection at close-in frequencies that are critically close to the passband. They also have significantly better performance at band rejection frequencies above 5 GHx. Moreover, measurements showed that the single FBAR filter will be destroyed with a continuous wave signal of 33 dBm, while the quad distributed FBAR filter was able to withstand up to 41 dbm before being damaged.

Figure 6:
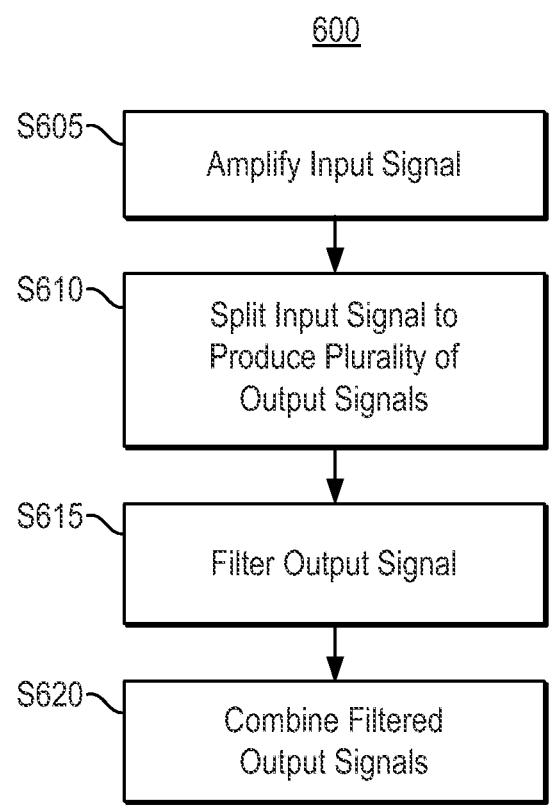
FIG. 6 is a flowchart illustrating a method of operating a system comprising a power amplifier and an acoustic resonator filter, according to a representative embodiment.

FIG. 6 is a flowchart illustrating a method of operating a system comprising a power amplifier and an acoustic resonator filter, according to a representative embodiment. In the description that follows, method features are indicated by parentheses.

Referring to FIG. 6, the method begins by amplifying an input signal (S605). This amplification can be accomplished, for instance, by FET transistors as illustrated in FIGS. 2A and 2B. Next, the amplified input signal is divided into multiple signal paths to produce multiple output signals (S610). This can be accomplished, for instance, by an MMIC as illustrated in FIG. 2A, or by an input splitter coupled to transmission lines, as illustrated in FIG. 3A. Next, the output signals are filtered by multiple corresponding acoustic resonator filters (S615). This can be accomplished, for instance, by FBAR filters as illustrated in FIGS. 2A-2B or FIGS. 3A-3B. Finally, the method combines the filtered output signals to produce a single output signal corresponding to the input signal (S620).

While example embodiments are disclosed, herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A system, comprising:
a power amplifier configured to amplify an input signal;
a splitter configured to split the amplified input signal into a plurality of output signals;
a plurality of filters configured to filter the plurality of output signals, respectively, to produce a plurality of filtered output signals; and
a combiner configured to combine the filtered output signals to produce a combined output signal, wherein the power amplifier outputs the plurality of output signals via a plurality of output ports, respectively; and
a plurality of input impedance matching circuits configured to match respective input impedances of the plurality of filters to respective output impedances of the plurality of output ports.

2. The system of claim 1, wherein each of the plurality of filters comprises an acoustic resonator.

3. The system of claim 2, wherein each of the acoustic resonators is a film bulk acoustic resonator (FBAR), a stacked bulk acoustic resonator (SBAR), a double bulk acoustic resonator (DBAR), a surface acoustic wave (SAW) resonator, or a bulk acoustic wave (BAW) resonator.

4. The system of claim 1, further comprising a plurality of output impedance matching circuits configured to match respective output impedances of the plurality of filters to an input impedance of a device receiving the combined output signal.

5. The system of claim 4, wherein each of the input impedance matching circuits and each of the output impedance matching circuits comprises an inductance-capacitance (LC) circuit.

6. The system of claim 1, wherein the power amplifier comprises a plurality of field effect transistors (FETs) each having a gate receiving the input signal and a drain transmitting one of the plurality of output signals.

7. The system of claim 6, wherein the power amplifier comprises a plurality of gain stages arranged in a sequence, and the plurality of FETs are located in an output stage of the sequence.

8. The system of claim 7, wherein the splitter is located within the power amplifier between two of the sequential gain stages.

9. The system of claim 6, wherein each of the plurality of FETs comprises a gallium arsenide (GaAs) pseudomorphic high electron mobility (pHEMT) transistor.

10. The system of claim 2, wherein the combiner comprises a plurality of transmission lines, and each of the acoustic resonators is connected to at least one helper inductor.

11. The system of claim 1, wherein the splitter is coupled to a plurality of transmission lines each coupled to one of the acoustic resonators.

12. The system of claim 1 wherein the input signal is a radio frequency (RF) signal or microwave frequency signal.

13. A method, comprising:
amplifying an input signal;
splitting the amplified input signal into a plurality of output signals;
filtering the plurality of output signals, respectively, to produce a plurality of filtered output signals; and
combining the filtered output signals to produce a combined, output signal, wherein the power amplifier outputs the plurality of output signals via a plurality of output ports, respectively; and
operating a plurality of input impedance matching circuits to match respective input impedances of the plurality of filters to respective output impedances of the plurality of output ports.

14. The method of claim 13, wherein each of the plurality of filters comprises an acoustic resonator.

15. The method of claim 14, wherein each of the acoustic resonators is a film bulk acoustic resonator (FBAR), a stacked bulk acoustic resonator (SBAR), or a double bulk acoustic resonator (DBAR), a surface acoustic wave (SAW) resonator, or a bulk acoustic wave (BAW) resonator.

16. The method of claim 13, further comprising operating a plurality of output impedance matching circuits to match respective output impedances of the plurality of filters to an input impedance of a device receiving the combined output signal.

17. The method of claim 16, wherein each of the input impedance matching circuits and each of the output impedance matching circuits comprises an inductance-capacitance (LC) circuit.

18. The method of claim 13, Wherein the power amplifier comprises a plurality of field effect transistors (FETs) each having as gate receiving the input signal and a drain transmitting one of the plurality of output signals, wherein the plurality of FETs are arranged in parallel in an output stage of the power amplifier.

* * * * *